US011870202B2

(12) United States Patent
Putti et al.

(10) Patent No.: US 11,870,202 B2
(45) Date of Patent: Jan. 9, 2024

(54) SOLID-STATE POWER AMPLIFIERS WITH COOLING CAPABILITIES

(71) Applicant: Applied Materials, Inc., Santa Clara, CA (US)

(72) Inventors: Rajesh Kumar Putti, Singapore (SG); Vinodh Ramachandran, Singapore (SG); Ananthkrishna Jupudi, Singapore (SG); Lean Wui Koh, Singapore (SG); Prashant Agarwal, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 679 days.

(21) Appl. No.: 17/009,851

(22) Filed: Sep. 2, 2020

(65) Prior Publication Data

US 2022/0069536 A1 Mar. 3, 2022

(51) Int. Cl.

*H03F 1/52* (2006.01)
*H01S 3/041* (2006.01)
*H01S 3/067* (2006.01)
*H01S 3/042* (2006.01)
*H01S 3/23* (2006.01)

(52) U.S. Cl.

CPC .............. *H01S 3/041* (2013.01); *H01S 3/042* (2013.01); *H01S 3/06779* (2013.01); *H01S 3/06783* (2013.01); *H01S 3/2308* (2013.01)

(58) Field of Classification Search

CPC .................................. H03F 1/52; H03F 3/187
USPC ...................................... 330/298, 207 P, 307
See application file for complete search history.

(56) References Cited

U.S. PATENT DOCUMENTS

| | | | |
|---|---|---|---|
| 5,745,076 A * | 4/1998 | Turlington ......... | H01Q 21/0087 342/372 |
| 10,264,663 B1 | 4/2019 | Long et al. | |
| 2005/0160987 A1 | 7/2005 | Kasai et al. | |
| 2010/0210225 A1 | 8/2010 | Lowell et al. | |
| 2012/0097970 A1 | 4/2012 | Siomkos et al. | |
| 2012/0247676 A1 | 10/2012 | Fujino et al. | |
| 2014/0374025 A1 | 12/2014 | Zhao et al. | |
| 2018/0269037 A1 | 9/2018 | Kamarehi et al. | |

OTHER PUBLICATIONS

International Search Report for PCT/US2021/047665, dated Dec. 15, 2021.

Amplus Communication, AM-2120 Series HI Powered C-Band SSPA Rack Mount, 54 Serangoon North Avenue, Level 4 Singapore 555854, www.APLUS.BIZ, Version 201903, 3 pages.

* cited by examiner

*Primary Examiner* — Henry Choe
(74) *Attorney, Agent, or Firm* — MOSER TABOADA

(57) ABSTRACT

Methods and apparatus for processing a substrate. For example, a processing chamber can include a power source, an amplifier connected to the power source, comprising at least one of a gallium nitride (GaN) transistor or a gallium arsenide (GaAs) transistor, and configured to amplify a power level of an input signal received from the power source to heat a substrate in a process volume, and a cooling plate configured to receive a coolant to cool the amplifier during operation.

14 Claims, 4 Drawing Sheets

SOLID-STATE POWER AMPLIFIERS WITH COOLING CAPABILITIES

FIELD

Embodiments of the present disclosure generally relate to solid-state power amplifiers (SSPAs). More particularly, embodiments of the disclosure relate to methods and apparatus using processing chambers comprising SSPAs with liquid cooling capabilities for processing a substrate.

BACKGROUND

Conventional SSPAs and traveling wave tube amplifiers (TWTA) configured for use with substrate processing chambers (e.g., for chip packaging) are known. Such amplifiers, however, can be quite large, have high power consumption, and/or generate large amounts of noise and/or heat.

SUMMARY

Methods and apparatus for processing a substrate are provided herein. In some embodiments, an apparatus can include processing chamber comprising a power source, an amplifier connected to the power source, comprising at least one of a gallium nitride (GaN) transistor or a gallium arsenide (GaAs) transistor, and configured to amplify a power level of an input signal received from the power source for heating a substrate in a process volume, and a cooling plate configured to receive a coolant for cooling the amplifier during operation.

In accordance with at least some embodiments, a method for processing a substrate in a processing chamber can include amplifying, using the amplifier comprising at least one of a gallium nitride (GaN) transistor or a gallium arsenide (GaAs) transistor, a power level of an input signal received from a power source, outputting an amplified signal to a substrate support disposed in a processing volume of the processing volume to heat a substrate, and supplying a coolant to a cooling plate disposed on the amplifier to cool the amplifier during operation.

In accordance with at least some embodiments, a non-transitory computer readable storage medium having stored thereon instructions that when executed cause a processor to perform a method for processing a substrate in a processing chamber. The method for processing a substrate in a processing chamber can include amplifying, using the amplifier comprising at least one of a gallium nitride (GaN) transistor or a gallium arsenide (GaAs) transistor, a power level of an input signal received from a power source, outputting an amplified signal to a substrate support disposed in a processing volume of the processing volume to heat a substrate, and supplying a coolant to a cooling plate disposed on the amplifier to cool the amplifier during operation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
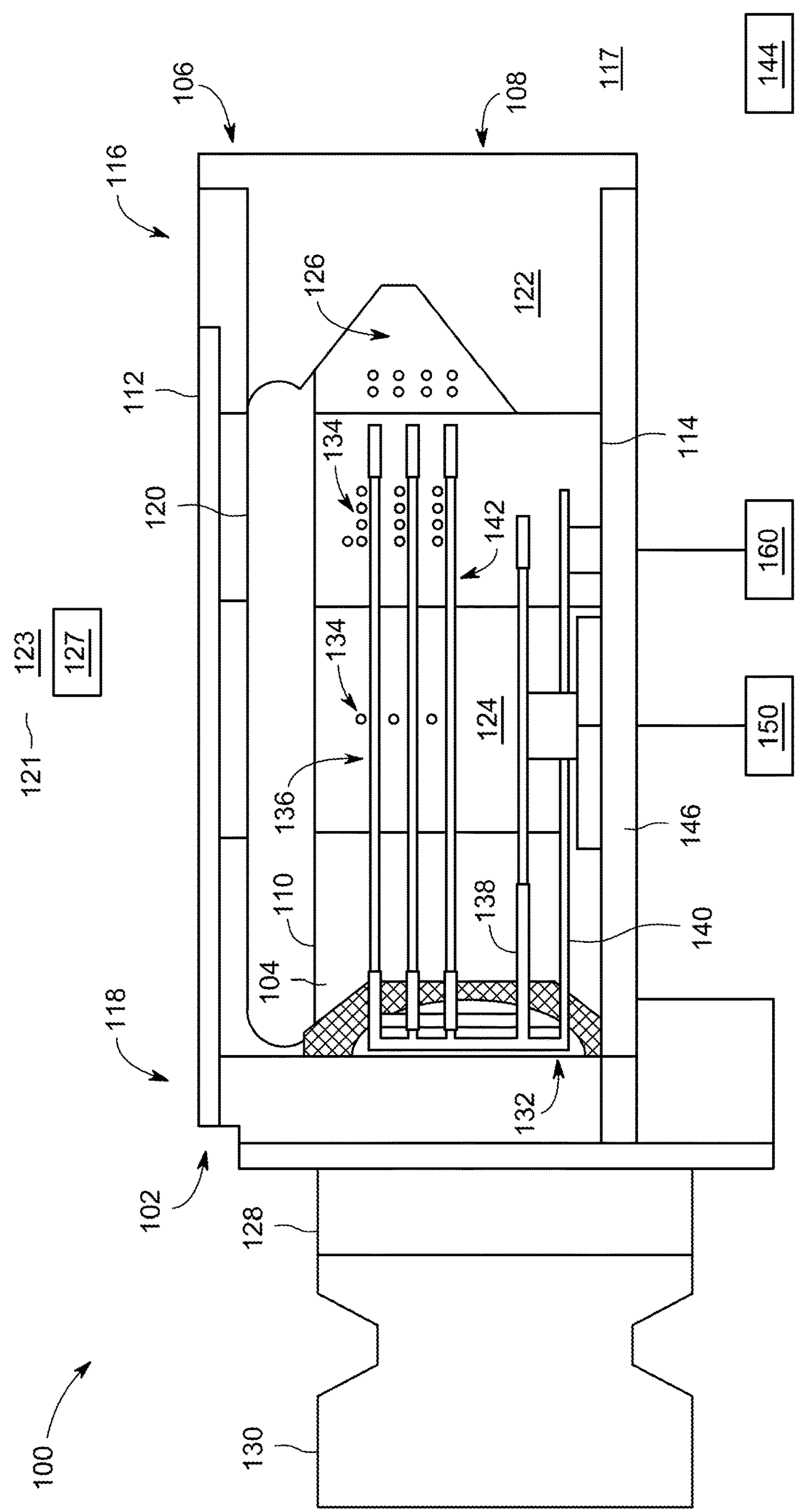
FIG. 1 is a schematic, cross-sectional view of a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus using processing chambers comprising SSPAs with liquid cooling capabilities are provided herein. One or more embodiments of the disclosure are directed to integrating SSPAs into one or more processing chambers. For example, the SSPAs can comprise gallium nitride (GaN) transistors, gallium arsenide (GaAs) transistors, and the like and can include a liquid cooling plate. In at least some embodiments, the processing chamber can be configured for three-dimensional chip packaging, e.g., under bump metallization (UMB), redistribution layer (RDL), complementary metal-oxide-semiconductor (CMOS) image sensor applications, etc. The processing chambers described herein use relatively compact high power SSPAs, which can be cooled using a cooling plate, thus providing low power consumption, low heat dissipation, and low noise generation, during operation.

The substrate processing chamber may advantageously be placed in line with a multi-chamber processing tool to save physical footprint and increase throughput. For example, the substrate process chamber may advantageously be placed below a load lock chamber of the multi-chamber processing tool so that there is no increase in tool footprint. An example of a multi-chamber processing tool that is suitable for use with the substrate processing chamber of the present disclosure is any of the Applied Charger® line of processing tools, commercially available from Applied Materials, Inc., of Santa Clara, Calif. Other processing chambers from Applied Materials, Inc., or other manufacturers, may also benefit from the inventive apparatus disclosed herein.

In some embodiments, the substrate processing chamber is configured to support one or more substrates to advantageously perform a batch degas process on the one or more substrates via microwave heating. The substrate processing chamber includes a configurable gas flow and pumping arrangement to accommodate degassing of various types of substrates and varied batch sizes. For example, silicon semiconductor substrates, polymer substrates, epoxy substrates, or any other substrates suitable for moisture removal via a microwave energy source. The substrate processing chamber described herein may be used at atmospheric pressure or sub-atmospheric pressure, for example $1\times10^{-7}$ pascal.

FIG. 1 is a schematic side view of a processing chamber (e.g., a degas process chamber) in accordance with at least some embodiments of the present disclosure. The processing chamber 100 includes a chamber body 102 having sidewalls 104, a lid 112, and a chamber floor 114 enclosing an interior volume 124 (e.g., a process volume). The sidewalls 104 include a plurality of openings 134 to flow one or more process gases into the interior volume 124. In some embodiments, the plurality of openings 134 are symmetrically arranged about the chamber body 102 to advantageously provide more uniform gas flow across the surfaces of the one or more substrates. One or more process gases may be supplied from a gas source (not shown) through a mass flow controller (not shown) into the interior volume 124 of the processing chamber 100. The process gasses can be any suitable process gas, such as an inert gas (e.g., argon) or nitrogen ($N_2$), for performing a degas process.

The chamber body 102 includes an upper portion 106 and a lower portion 108. The lid 112 is disposed on an upper surface of the upper portion 106. The lower portion 108 includes a base plate 146 having a surface that defines the chamber floor 114.

A first elongated opening 110 that can be selectively sealed (e.g., a slit valve opening) is disposed in the upper portion 106 of the chamber body 102 for transferring one or more substrates into or out of the chamber body 102. For example, the first elongated opening 110 can facilitate the transferring of one or more substrates between the chamber body and a factory interface of a multi-chamber processing tool. In some embodiments, a second elongated opening 120 that can be selectively sealed (e.g., a second slit valve opening) is disposed in the upper portion 106 of the chamber body 102 for transferring one or more substrates into or out of the chamber body 102. For example, the second elongated opening 120 can facilitate the transferring of one or more substrates between the chamber body 102 and a load lock chamber or other chambers of a multi-chamber processing tool. In some embodiments, the first elongated opening 110 is disposed opposite the second elongated opening 120.

The chamber body 102 includes a first end 116 opposite a second end 118 to which a microwave source 144 can be coupled. In at least some embodiments, the microwave source 144 is coupled to the chamber body 102 at the first end 116. The microwave source 144 is configured to provide volumetric heating to the interior volume 124 to degas one or more substrates disposed within the interior volume 124. In some embodiments, the microwave source is a variable frequency microwave source with each frequency being active for a brief duration in time. For example, in some embodiments, the brief duration in time is in the order of milliseconds. In some embodiments, the microwave source provides microwave energy to the chamber body 102 at frequencies from about 5.0 GHz to about 7.0 GHz. In some embodiments, the microwave source 144 provides microwave energy with microwave frequencies from about 5.85 GHz to about 6.65 GHz. In some embodiments, the microwave energy is from a broad C-band source. In some embodiments, a sweep rate is about 0.25 microseconds per frequency across 4096 frequencies in the C-band. The use of variable frequency and a fast sweeping prevents standing wave formation and charge accumulation and the need for rotating thermal load. The use of variable frequency also allows for uniform cross substrate temperature distribution.

In some embodiments, the first end 116 includes a service door 122 that is selectively sealable and removable from the rest of the chamber body 102. The service door 122 is advantageously removable to allow service and installation of components within the interior volume 124 of the chamber body 102. A funnel 126 extends from an outer surface of the chamber body 102 to one of the sidewalls 104 to expose the interior volume 124 to microwave energy provided by the microwave source 144. In some embodiments, the funnel 126 can be in one of the sidewalls 104 defined by the service door 122. In some embodiments, the microwave source 144 provides microwaves having a given wavelength and the funnel 126 is disposed at least two times the given wavelength away from a closest portion of a substrate support 136 disposed in the interior volume 124 to provide more uniform heating to the one or more substrates when disposed on the substrate support 136.

The second end 118 includes a pump port 132, or exhaust port, disposed in the chamber body 102, opposite the funnel 126. The pump port 132 is fluidly coupled to a pump 130. The pump 130 can be any pump suitable for evacuating degassed material from the interior volume 124 and/or facilitating maintaining a desired pressure inside the processing chamber 100. In some embodiments, a pump adapter 128 is disposed between the pump port 132 and the pump 130 to facilitate the coupling of various different pumps to the pump port 132.

In some embodiments, and as shown in FIG. 1, the substrate support 136 is configured to support a plurality of substrates. For example, in some embodiments, the substrate support 136 includes a plurality of support members 142 disposed in a vertically spaced apart orientation along a common axis of the substrate support (e.g., aligned along a vertical axis). While three support members 142 are shown, the substrate support 136 may include any number of support members 142. In some embodiments, the plurality of support members 142 are coupled to a base ring 138 disposed below the plurality of support members 142. In some embodiments, the substrate support 136 includes a plurality of lift members (not shown) corresponding to the plurality of support members 142. The plurality of lift members can be coupled to a lift ring 140 disposed below the plurality of lift members.

In some embodiments, the base ring 138 is coupled to the first actuator 150 that controls the position of the plurality of support members 142 at least between a transfer position and a processing position. In some embodiments, the lift ring 140 is coupled to a second actuator 160 that controls the position of a plurality of lift members 220 independently of the position of the plurality of support members 142. The first actuator 150 and the second actuator 160 can be any suitable linear motion controller, such as a linear drive servo actuator motor, or the like. The first actuator 150 and the second actuator 160 may be disposed outside of the chamber body 102 and pass through an opening in the chamber floor 114 of the chamber body 102 sealed with, for example, a stainless steel bellows, or the like.

One or more amplifiers can be connected to microwave source 144. For example, one or more SSPAs 117 can be connected to the microwave source 144. For example, in at least some embodiments, the SSPA is connected to the microwave source 144 and configured to amplify a power level of an input signal received therefrom (e.g., for heating a substrate in the interior volume 124). For example, in at least some embodiments the SSPA 117 is configured to receive an input signal from the microwave source 144 from about 0.001 W to about 0.025 W and amplify the received input signal to provide an output power from about 800 W to about 1000 W (e.g., at frequency from about 5.0 GHz to about 7.0 GHz).

Figure 2:
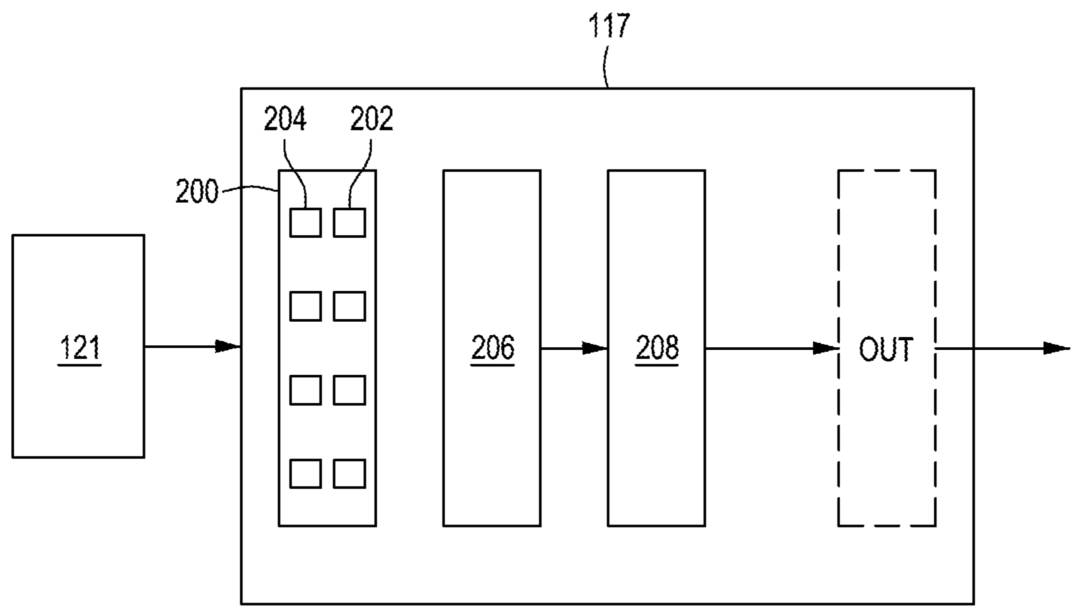
FIG. 2 is a schematic diagram of an SSPA in accordance with at least some embodiments of the present disclosure.
Figure 3:
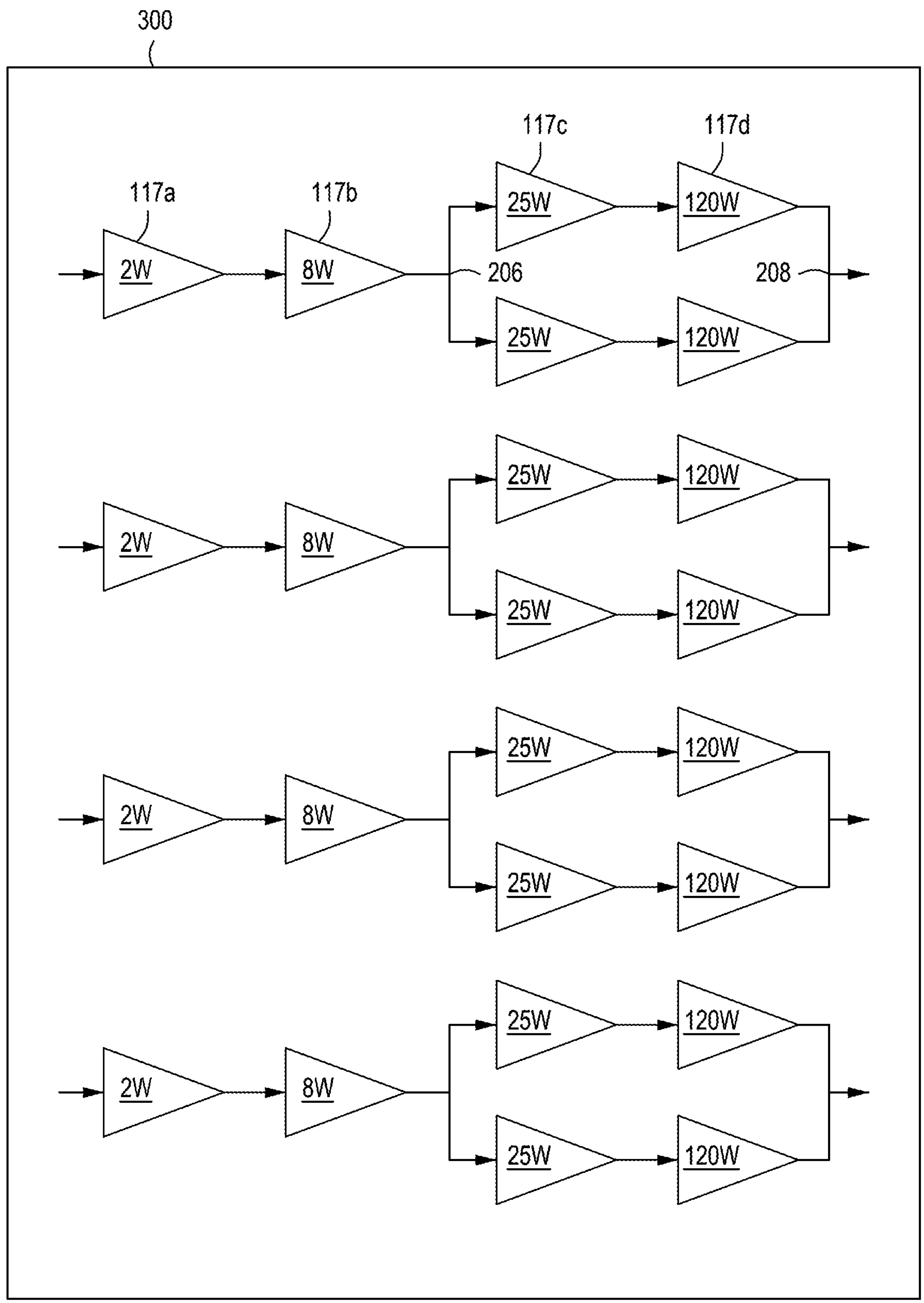
FIG. 3 is a diagram of a transistor configuration in accordance with at least some embodiments of the present disclosure.

Continuing with reference to FIGS. 2 and 3, the SSPA 117 comprises one or more transistors 200. For example, in at least some embodiments, the one or more transistors 200 can include one or more of gallium nitride (GaN) transistors 202, gallium arsenide (GaAs) transistors 204, or other suitable transistors capable of performing the operations described herein.

Additionally, the SSPA 117 can include other circuitry to facilitate amplifying a power level of an input signal received from one or more of the above described power sources. For example, in at least some embodiments, the SSPA 117 can include at least one of power dividers 206, power combiners 208 or the like.

In at least some embodiments, an array 300 of SSPAs 117 can be provided (FIG. 3). The array 300 of SSPAs 117 can be configured in various configurations. For example, the array 300 of SSPAs 117 can include SSPAs comprising one or more of the above described transistors with the same or different power ratings, e.g., from about 2 W to about 120 W. The SSPAs 117 in the array 300 can be connected in series and/or parallel with each other. For illustrative purposes, the array 300 is shown including four rows of SSPAs each including four columns of SSPAs (respectively labelled 117*a*-117*d*). Each row includes a first SSPA 117*a* (e.g., with a power rating of 2 W to about 8 W) connected in series with a second SSPA 117*b* (e.g., with a power rating of 2 W to about 15 W). A power divider 206 receives an input signal from the second SSPA 117*b* and divides the input signal into two separate output signals that are inputted to two third SSPAs 117*c* (e.g., each with a power rating of 2 W to about 25 W) that are connected in parallel to each other. Each third SSPA 117*c* provides a corresponding output signal that is inputted to corresponding fourth SSPAs 117*d* (e.g., each with a power rating of 2 W to about 120 W). Each fourth SSPA 117*d* provides a corresponding output signal that is inputted to the power combiner 208 (e.g., shown in FIG. 2) that combines the two input signals into a single output signal that can be used as needed, for example, to transmit power to the interior volume 124 (e.g., the substrate processing cavity).

Figure 4:
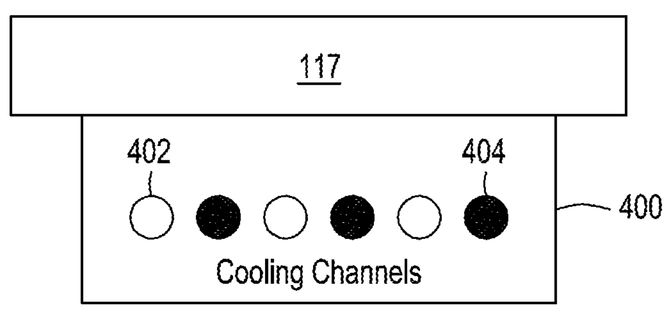
FIG. 4 is a side view of the SSPA disposed on a cooling plate in accordance with at least some embodiments of the present disclosure.
Figure 4:
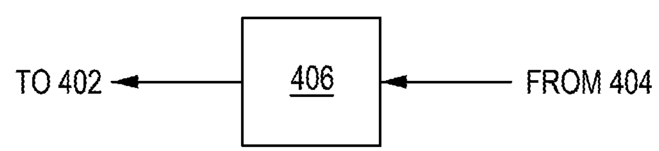

With reference to FIG. 4, the SSPA 117 (or the array of SSPAs 300) can be disposed on a cooling plate 400. The cooling plate 400 comprises one or more cooling channels. For example, in at least some embodiments, the one or more cooling channels can include an input channel 402 and an output channel 404 that are connected to a fluid source 406 which can be connected to the processing chamber 100. The fluid source 406 is configured to provide one or more coolants to the cooling plate 400. For example, in at least some embodiments, the fluid source 406 can be configured to provide chilled water to the cooling plate 400 for cooling the amplifier (e.g., the SSPA 117) during operation.

In embodiments that use an array of SSPAs, each SSPA in the array can be disposed on a corresponding cooling plate. Alternatively, some SSPAs in the array can include a corresponding cooling plate and some SSPAs in the array can be disposed on a shared cooling plate. Alternatively, all the SSPAs in the array can be disposed on a shared cooling plate.

A controller 121 including a processor 123 is configured (or programmed) to control the overall operation of the processing chamber 100. For example, the controller 121, under control of the processor 123, can receive a recipe that is input into a memory 127 of the processor 123. For example, the memory 127 can be a non-transitory computer readable storage medium having instructions that when executed by the processor 123 (or controller 121) perform the methods described herein. The recipe can include information relating to one or more parameters associated with one or more of the aforementioned components used for processing the substrate. For example, the controller 121 can use the information in the recipe for controlling the microwave source 144, the SSPA 117, the power divider 206, the power combiner 208, input/output signals to/from the SSPA 117, the pump 130, the fluid source 406, a gas source, etc.

Figure 5:
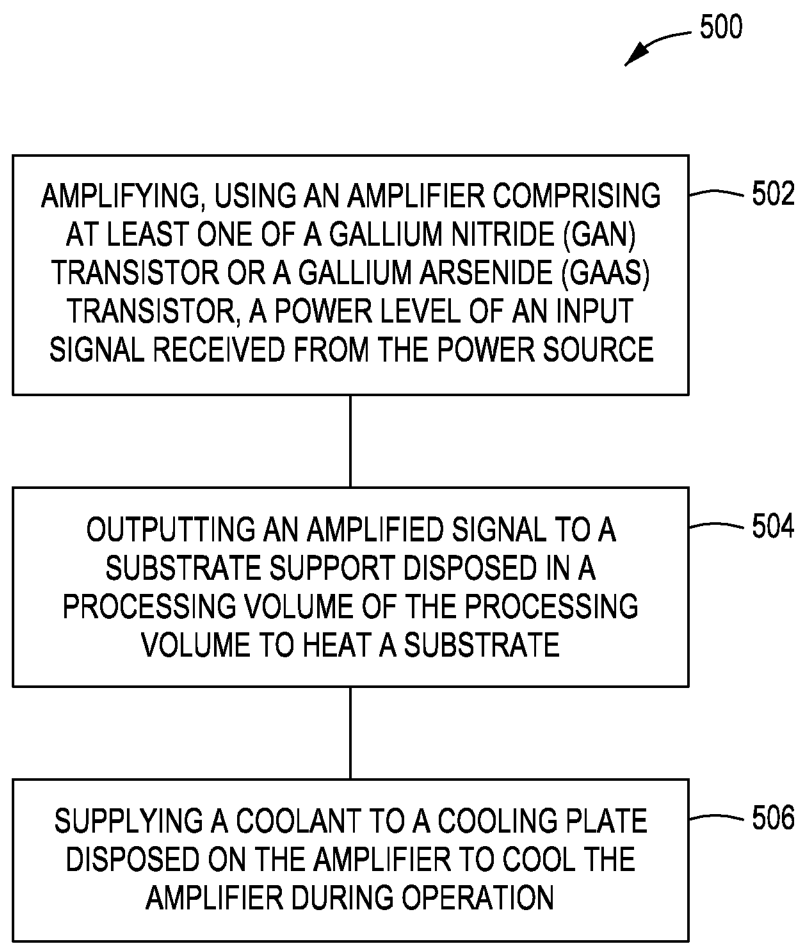
FIG. 5 is a flowchart of a method for processing a substrate in accordance with at least some embodiments of the present disclosure.

FIG. 5 is a flowchart of a method 500 for processing a substrate. The method 500 generally begins where power is supplied from a power source to an amplifier. For example, in at least some embodiments, the controller 121 can control power supplied to the one or more of the above described power sources, e.g., the microwave source 144. For example, in at least some embodiments, the controller 121 can be in communication with the microwave source 144 and the SSPA 117 to control power for heating a substrate.

Next, at 502, using an amplifier comprising at least one of a gallium nitride (GaN) transistor or a gallium arsenide (GaAs) transistor, a power level of an input signal received from the power source, e.g., the microwave source 144, is amplified. For example, when the SSPA 117 is connected to the microwave source 144, the controller 121 can be configured to control inputs/outputs to/from the one or more transistors on the SSPA 117, and at 504 can provide the output (e.g., an amplified signal) from the SSPA 117 to the substrate support 136 for heating the substrate.

Next, at 506, a coolant is supplied to a cooling plate disposed on the amplifier to cool the amplifier during operation. For example, the controller 121 can be configured to control the fluid source 406 for controlling an amount of coolant (e.g., chilled water) to the cooling plate 400.

While the foregoing is directed to embodiments of the present disclosure, other and further embodiments of the disclosure may be devised without departing from the basic scope thereof.

The invention claimed is:

1. A processing chamber, comprising:

a power source;

an amplifier connected to the power source, comprising at least one of a gallium nitride (GaN) transistor or a gallium arsenide (GaAs) transistor, and configured to amplify a power level of an input signal received from the power source to heat a substrate in a process volume;

a cooling plate configured to receive a coolant to cool the amplifier during operation, wherein the cooling plate includes a plurality of cooling channels configured to allow the coolant to flow within the cooling plate; and a controller in communication with the amplifier and configured to control a flow of the coolant through the plurality of cooling channels.

2. The processing chamber of claim 1, wherein the processing chamber is a degas process chamber.

3. The processing chamber of claim 1, wherein the amplifier is a solid-state power amplifier (SSPA) that provides power from about 800 W to about 1000 W.

4. The processing chamber of claim 1, wherein the power source is configured to provide power at a frequency from about 5.0 GHz to about 7.0 GHz.

5. The processing chamber of claim 1, wherein the amplifier comprises at least one of power dividers or power combiners.

6. The processing chamber of claim 1, wherein the coolant is chilled water.

7. The processing chamber of claim 1, wherein the cooling plate is disposed under the amplifier.

8. A method for processing a substrate in a processing chamber, comprising:

amplifying, using an amplifier comprising at least one of a gallium nitride (GaN) transistor or a gallium arsenide (GaAs) transistor, a power level of an input signal received from a power source;

outputting an amplified signal to a substrate support disposed in a processing volume of the processing volume to heat a substrate;

supplying a coolant to a cooling plate disposed on the amplifier to cool the amplifier during operation, wherein supplying the coolant comprises circulating the coolant through a plurality of cooling channels configured to allow the coolant to flow within the cooling plate; and controlling flow of the coolant through the plurality of cooling channels using a controller in communication with the amplifier.

9. The method of claim 8, wherein processing the substrate is performed in a degas process chamber.

10. The method of claim 8, wherein amplifying the power level of the input signal comprises using a solid-state power amplifier (SSPA) that provides power from about 800 W to about 1000 W.

11. The method of claim 8, wherein supplying power comprises supplying power at a frequency from about 5.0 GHz to about 7.0 GHz.

12. The method of claim 8, wherein supplying power comprises using at least one of power dividers or power combiners.

13. The method of claim 8, wherein circulating the coolant comprises circulating one of a liquid or a gas.

14. The method of claim 8, wherein the cooling plate is disposed under the amplifier.

* * * * *